(12) United States Patent
Kuo et al.

(10) Patent No.: US 11,137,246 B2
(45) Date of Patent: Oct. 5, 2021

(54) OPTICAL DEVICE

(71) Applicant: HIMAX TECHNOLOGIES LIMITED, Tainan (TW)

(72) Inventors: Han-Yi Kuo, Tainan (TW); Kuan-Ming Chen, Tainan (TW); Li-Chiu Tsai, Tainan (TW); Meng-Ko Tsai, Tainan (TW)

(73) Assignee: HIMAX TECHNOLOGIES LIMITED, Tainan (TW)

( * ) Notice: Subject to any disclaimer, the term of this patent is extended or adjusted under 35 U.S.C. 154(b) by 0 days.

(21) Appl. No.: 16/264,608

(22) Filed: Jan. 31, 2019

(65) Prior Publication Data
US 2020/0251886 A1  Aug. 6, 2020

(51) Int. Cl.
| | |
|---|---|
| *G01B 11/25* | (2006.01) |
| *G02B 27/42* | (2006.01) |
| *H01S 5/42* | (2006.01) |
| *H01S 5/40* | (2006.01) |
| *H01S 5/183* | (2006.01) |
| *G02B 3/00* | (2006.01) |

(Continued)

(52) U.S. Cl.
CPC .......... *G01B 11/2513* (2013.01); *G01B 11/25* (2013.01); *G02B 3/0037* (2013.01); *G02B 3/0043* (2013.01); *G02B 3/0068* (2013.01); *G02B 27/0905* (2013.01); *G02B 27/4205* (2013.01); *H01S 5/183* (2013.01); *H01S 5/4081* (2013.01); *H01S 5/423* (2013.01); *H01S 5/005* (2013.01); *H01S 2301/20* (2013.01)

(58) Field of Classification Search
CPC ..... H01S 5/18–18397; H01S 5/42–423; H01S 5/005; H01S 5/0071; H01S 2301/18; H01S 2301/20; H01S 5/18388; H01S 5/4081; G02B 3/005–0068; G02B 27/0944; G02B 27/0061; G02B 27/123; G02B 27/0905; G02B 3/0062–0068; G01B 11/25; G01N 2201/0635; G01N 2201/0638–0639; G06T 7/521
See application file for complete search history.

(56) References Cited

U.S. PATENT DOCUMENTS 4,867,514 A * 9/1989 Waldron ................ G02B 3/005
359/355
5,477,383 A * 12/1995 Jain ...................... G02B 3/0056
359/565

(Continued)

FOREIGN PATENT DOCUMENTS

| CN | 101523110 A * 9/2009 ........... G02B 6/0025 |
|---|---|
| CN | 104136958 A * 11/2014 ............... G08G 1/04 |

(Continued)

*Primary Examiner* — Joshua King
(74) *Attorney, Agent, or Firm* — CKC & Partners Co., LLC

(57) ABSTRACT

An optical device including a Vertical-Cavity Surface-Emitting Laser (VCSEL) light source and a lens array is provided. The VCSEL light source is configured to emit light with at least one light dot. The lens array is configured to receive light emitting from the VCSEL light source and then project a structured light. The structured light includes a dot pattern having number of light dots. Plural convex lenses are arranged along a first surface of the lens array. The convex lenses are configured to generate the light dots of the dot pattern.

7 Claims, 4 Drawing Sheets

(51) Int. Cl.
*G02B 27/09* (2006.01)
*H01S 5/00* (2006.01)

(56) References Cited

U.S. PATENT DOCUMENTS

| | | | | |
|---|---|---|---|---|
| 6,122,108 | A * | 9/2000 | Tholl | G02B 26/0875 359/619 |
| 6,124,975 | A * | 9/2000 | Dona | B44F 1/06 359/619 |
| 6,473,238 | B1 * | 10/2002 | Daniell | G02B 3/0068 359/622 |
| 6,875,993 | B2 * | 4/2005 | Tatum | G01S 7/412 250/559.2 |
| 7,085,062 | B2 * | 8/2006 | Hauschild | G02B 27/0944 359/558 |
| 7,764,428 | B2 * | 7/2010 | Hayashi | G02B 3/0043 359/619 |
| 8,320,621 | B2 * | 11/2012 | McEldowney | G03B 17/54 356/5.01 |
| 8,749,796 | B2 * | 6/2014 | Pesach | G01B 11/25 356/610 |
| 9,273,846 | B1 * | 3/2016 | Rossi | F21V 5/007 |
| 9,347,642 | B2 * | 5/2016 | Catalano | F21V 5/04 |
| 9,377,603 | B1 * | 6/2016 | Cheng | G02B 13/0085 |
| 9,686,839 | B1 * | 6/2017 | Chern | G02B 27/30 |
| 10,509,147 | B2 * | 12/2019 | Rossi | G02B 3/0062 |
| 2002/0008917 | A1 * | 1/2002 | Daniell | G02B 30/27 359/622 |
| 2004/0165823 | A1 * | 8/2004 | Morris | G02B 27/0037 385/33 |
| 2005/0069012 | A1 * | 3/2005 | Shimomura | H01S 5/36 372/87 |
| 2005/0286123 | A1 * | 12/2005 | Abu-Ageel | G02B 6/0096 359/443 |
| 2007/0019909 | A1 * | 1/2007 | Yamauchi | G02B 27/1046 385/37 |
| 2007/0071056 | A1 * | 3/2007 | Chen | G01S 17/87 372/50.124 |
| 2007/0268794 | A1 * | 11/2007 | Hill | G02B 27/0905 369/44.23 |
| 2008/0239065 | A1 * | 10/2008 | Momonoi | H04N 13/207 348/49 |
| 2009/0161213 | A1 * | 6/2009 | Lin | G02B 3/0068 359/485.01 |
| 2010/0078483 | A1 * | 4/2010 | Liu | G06K 7/10732 235/462.42 |
| 2011/0103056 | A1 * | 5/2011 | Wolak | G02B 19/0057 362/235 |
| 2011/0157706 | A1 * | 6/2011 | Mitra | G02B 27/0905 359/619 |
| 2012/0140109 | A1 * | 6/2012 | Shpunt | H04N 5/2254 348/345 |
| 2013/0038941 | A1 * | 2/2013 | Pesach | G01B 11/25 359/619 |
| 2013/0163626 | A1 * | 6/2013 | Seurin | F21L 4/02 372/35 |
| 2013/0201424 | A1 * | 8/2013 | Uchida | G02F 1/133606 349/64 |
| 2013/0206967 | A1 * | 8/2013 | Shpunt | H01S 5/02288 250/216 |
| 2013/0272028 | A1 * | 10/2013 | Hong | G02B 6/0036 362/612 |
| 2014/0285693 | A1 * | 9/2014 | Kobayashi | G02B 3/0043 348/294 |
| 2015/0055349 | A1 * | 2/2015 | Mayer | F21V 5/04 362/311.02 |
| 2015/0097947 | A1 * | 4/2015 | Hudman | G01S 17/89 348/136 |
| 2015/0176977 | A1 * | 6/2015 | Abele | G02B 26/0833 356/614 |
| 2015/0316368 | A1 * | 11/2015 | Moench | G01S 7/4815 348/46 |
| 2015/0355470 | A1 * | 12/2015 | Herschbach | G02B 27/0977 362/11 |
| 2015/0377450 | A1 * | 12/2015 | Suh | G02B 3/0068 362/319 |
| 2016/0216522 | A1 * | 7/2016 | Dubost | G02B 27/0911 |
| 2016/0223823 | A1 * | 8/2016 | Chern | G02B 27/0944 |
| 2016/0254638 | A1 * | 9/2016 | Chen | H04N 13/254 362/11 |
| 2016/0336716 | A1 * | 11/2016 | Adachi | H01S 5/02288 |
| 2016/0377414 | A1 * | 12/2016 | Thuries | G01B 11/02 356/625 |
| 2017/0033535 | A1 * | 2/2017 | Joseph | H01S 5/423 |
| 2017/0123218 | A1 * | 5/2017 | Stigwall | G01C 3/18 |
| 2018/0252799 | A1 * | 9/2018 | Bakin | G02B 19/0061 |
| 2018/0267214 | A1 * | 9/2018 | Rossi | G02B 3/0056 |
| 2019/0251699 | A1 * | 8/2019 | Chih | H04R 1/342 |
| 2019/0264890 | A1 * | 8/2019 | Chang | G02B 3/0056 |
| 2019/0293954 | A1 * | 9/2019 | Lin | G02B 27/1086 |
| 2020/0142210 | A1 * | 5/2020 | Cheng | G02B 27/4205 |

FOREIGN PATENT DOCUMENTS

| | | | | |
|---|---|---|---|---|
| CN | 204422873 | U * | 6/2015 | |
| CN | 104834029 | A * | 8/2015 | G02B 3/0037 |
| CN | 205002744 | U * | 1/2016 | G06T 7/521 |
| CN | 106501995 | A * | 3/2017 | |
| CN | 106990660 | A | 7/2017 | |
| CN | 206833079 | U * | 1/2018 | |
| CN | 206877029 | U | 1/2018 | |
| CN | 106406002 | B | 5/2018 | |
| CN | 108132573 | A * | 6/2018 | |
| CN | 108169981 | A * | 6/2018 | |
| CN | 108490633 | A * | 9/2018 | |
| CN | 207908819 | U * | 9/2018 | |
| CN | 108957911 | A | 12/2018 | |
| JP | 2003344610 | A * | 12/2003 | |
| TW | 201510554 | A | 3/2015 | |
| TW | 201514544 | A | 4/2015 | |
| WO | WO-2005050264 | A2 * | 6/2005 | G02B 27/0966 |
| WO | WO-2016122404 | A1 * | 8/2016 | G02B 3/0056 |
| WO | WO-2017042943 | A1 * | 3/2017 | F21V 5/04 |
| WO | WO-2018086980 | A1 * | 5/2018 | G02B 3/0043 |
| WO | WO-2019099297 | A1 * | 5/2019 | G02B 19/0014 |

* cited by examiner

OPTICAL DEVICE

BACKGROUND

Field of Invention

The present invention relates to an optical device. More particularly, the present invention relates to an optical device for providing a structured light with a specified pattern.

Description of Related Art

A structured light is a lighting with a specified pattern. The structured light can be projected onto one or more objects of interest. The reflected light reflected by the objects is sensed by one or more imagers to generate a three-dimensional image for stereo image matching. The applications of the structured light are emergently increased and the associated technologies have been widely researched and developed.

One known structured light generation unit includes a multi-dots emitting light source, a projection lens, and a diffractive optical element (DOE). However, due to back-focusing and the longer length of the projection lens, the space utilization of this known structured light generation unit is poor. Another known structured light generation unit includes a light source, a hard mask, and a projection lens. However, the hard mask blocks some of the light emitting from the light source, and thus the efficiency of this known structured light generation unit is poor. Another known structured light generation unit includes an edge emitting laser, a collimator lens, and a DOE. However, the DOE manufacturing process of is hard to control, and the DOE has an issue of zero order power. Another known structured light generation unit includes a multi-dots emitting light source, a diffraction lens, and a DOE. However, it is difficult to manufacture the diffraction lens and the DOE into one component and the diffractive efficiency of this known structured light generation unit is poor.

SUMMARY

One aspect of the invention is directed to an optical device including a Vertical-Cavity Surface-Emitting Laser (VCSEL) light source and a lens array. The VCSEL light source is configured to emit light with at least one light dot. The lens array is configured to receive light emitting from the VCSEL light source and then project a structured light. The structured light includes a dot pattern having number of light dots. Plural convex lenses are arranged along a first surface of the lens array. The convex lenses are configured to generate the light dots of the dot pattern.

In accordance with one or more embodiments of the invention, plural concave lenses are arranged along a second surface of the lens array opposite to the first surface. The first surface corresponds to a light incident surface of the lens array and the second surface corresponds to a light exit surface of the lens array. The concave lenses are configured to increase field of view (FOV) of the optical device.

In accordance with one or more embodiments of the invention, the dot pattern of the structured light is determined according to at least one of a divergence angle of the VCSEL light source, a pitch of the VCSEL light source, the number of light dots of the VCSEL light source, a pitch of each of the convex lenses, a sag height of each of the convex lenses, a substrate thickness of the lens array, a back focal length (BFL) between the VCSEL light source and the lens array.

In accordance with one or more embodiments of the invention, the dot pattern of the structured light is determined according to at least one of a divergence angle of the VCSEL light source, a pitch of the VCSEL light source, the number of light dots of the VCSEL light source, a pitch of each of the concave lenses, a sag height of each of the concave lenses, a pitch of each of the convex lenses, a sag height of each of the convex lenses, a substrate thickness of the lens array, a back focal length (BFL) between the VCSEL light source and the lens array.

In accordance with one or more embodiments of the invention, an arrangement of the light dots of the VCSEL light source is designed according to a pitch of each of the convex lenses so as to determine an arrangement of the light dots of the dot pattern of the structured light or to increase the number of the light dots of the dot pattern of the structured light.

Another aspect of the invention is directed to an optical device including a VCSEL light source, a lens array, and a diffractive optical element (DOE). The VCSEL light source is configured to emit light with at least one light dot. The lens array is configured to receive light emitting from the VCSEL light source and then project a patterned light with number of light dots. The DOE is configured to fan out the patterned light and then project a structured light. The structured light includes a dot pattern having number of light dots. The DOE is configured to increase field of view (FOV) of the optical device and generate the light dots of the dot pattern. The number of light dots of the dot pattern is larger than the number of light dots of the patterned light.

In accordance with one or more embodiments of the invention, plural convex lenses are arranged along a first surface of the lens array. The convex lenses are configured to generate the light dots of the patterned light.

In accordance with one or more embodiments of the invention, plural concave lenses are arranged along a second surface of the lens array opposite to the first surface. The first surface corresponds to a light incident surface of the lens array and the second surface corresponds to a light exit surface of the lens array. The concave lenses are configured to increase field of view (FOV) of the optical device.

In accordance with one or more embodiments of the invention, the dot pattern of the structured light is determined according to at least one of a divergence angle of the VCSEL light source, a pitch of the VCSEL light source, the number of light dots of the VCSEL light source, a pitch of each of the convex lenses, a sag height of each of the convex lenses, a substrate thickness of the lens array, or a back focal length (BFL) between the VCSEL light source and the lens array.

In accordance with one or more embodiments of the invention, the dot pattern of the structured light is determined according to at least one of a divergence angle of the VCSEL light source, a pitch of the VCSEL light source, the number of light dots of the VCSEL light source, a pitch of each of the concave lenses, a sag height of each of the concave lenses, a pitch of each of the convex lenses, a sag height of each of the convex lenses, a substrate thickness of the lens array, or a back focal length (BFL) between the VCSEL light source and the lens array.

In accordance with one or more embodiments of the invention, an arrangement of the light dots of the VCSEL light source is designed according to a pitch of each of the convex lenses so as to determine an arrangement of the light dots of the dot pattern of the structured light or to increase the number of the light dots of the dot pattern of the structured light.

In accordance with one or more embodiments of the invention, a structure of the DOE is designed to diffract the patterned light so as to determine an arrangement of the light dots of the dot pattern of the structured light or to increase the number of the light dots of the dot pattern of the structured light.

BRIEF DESCRIPTION OF THE DRAWINGS

The invention can be more fully understood by reading the following detailed description of the embodiment, with reference made to the accompanying drawings as follows.

DETAILED DESCRIPTION

Specific embodiments of the present invention are further described in detail below with reference to the accompanying drawings, however, the embodiments described are not intended to limit the present invention and it is not intended for the description of operation to limit the order of implementation. Moreover, any device with equivalent functions that is produced from a structure formed by a recombination of elements shall fall within the scope of the present invention. Additionally, the drawings are only illustrative and are not drawn to actual size.

Figure 1:
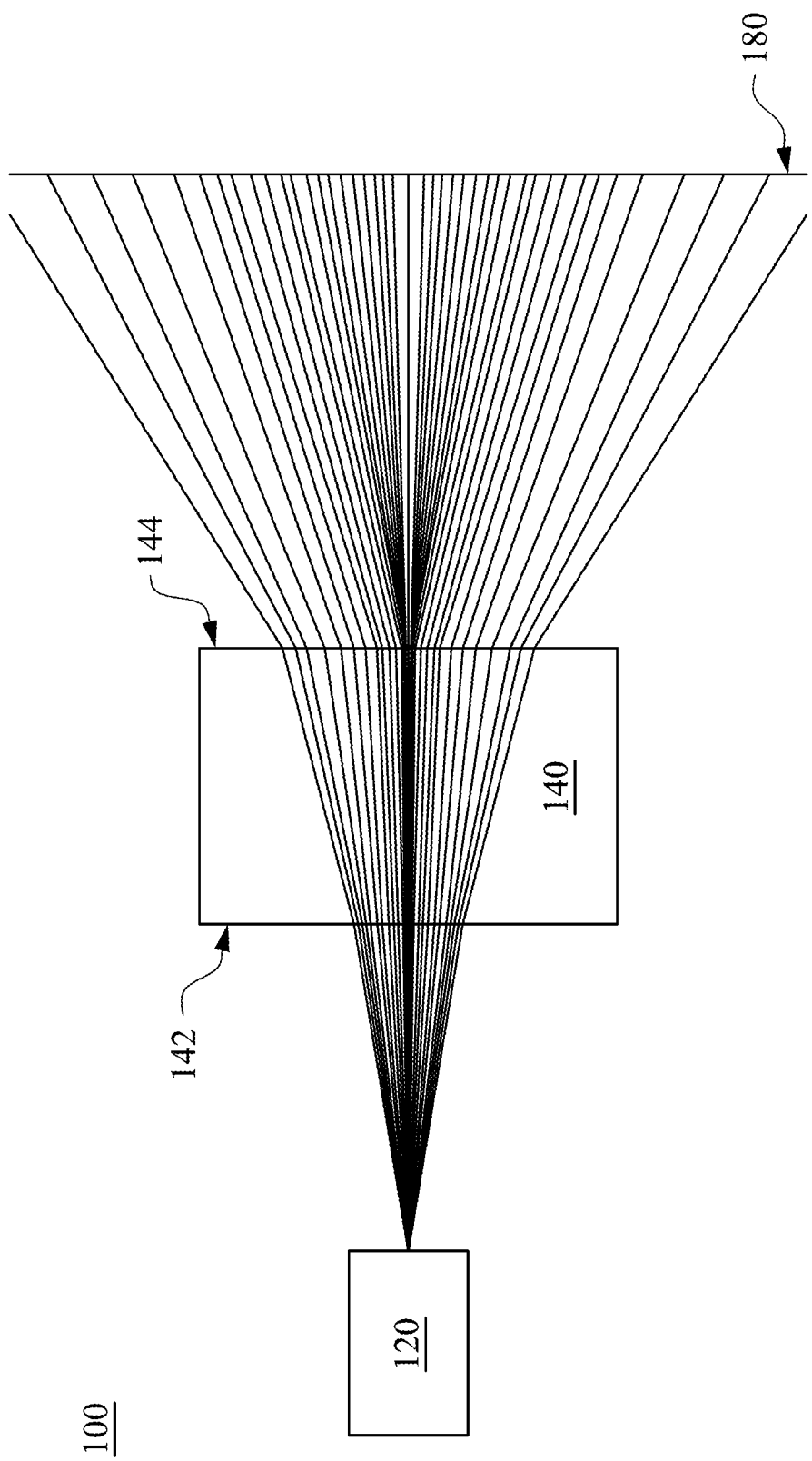
FIG. 1 illustrates an optical device according to a first embodiment of the present invention.

FIG. 1 illustrates an optical device 100 according to a first embodiment of the present invention. The optical device 100 includes a Vertical-Cavity Surface-Emitting Laser (VCSEL) light source 120 and a lens array 140. The VCSEL light source 120 is configured to emit light toward the lens array 140. In the first embodiment of the present invention, the VCSEL light source 120 may be a single point light source or a multi-point light source, such as a light source with 1×1 light dot, 3×3 light dots, or 9×9 light dots.

The lens array 140 is configured to receive light emitting from the VCSEL light source 120 and then project a structured light onto a plane 180. The structured light includes a dot pattern having number of light dots for specific purpose, such as 3D sensing or stereo image matching. The number of light dots of the dot pattern of the structured light is larger than the number of light dots of the VCSEL light source 120. The lens array 140 has two surfaces opposite to each other, i.e., a light incident surface 142 and a light exit surface 144. The light incident surface 142 is closer to the VCSEL light source 120 than the light exit surface 144.

Plural concave lenses are arranged along the light incident surface 142 of the lens array 140, and plural convex lenses are arranged along the light exit surface 144 of the lens array 140. However, the first embodiment of the present invention is not limited thereto. For example, the light incident surface 142 may be a flat surface and the convex lenses may be arranged along the light exit surface 144 of the lens array 140. For another example, the convex lenses may be arranged along the light incident surface 142 of the lens array 140 and the light exit surface 144 may be a flat surface.

It is noted that the convex lenses are configured to generate the light dots of the dot pattern of the structured light. It is noted that the concave lenses are configured to increase field of view (FOV) of the optical device 100.

In the first embodiment of the present invention, the dot pattern of the structured light projected by the lens array 140 with the concave lenses and the convex lenses respectively arranged along two opposite surfaces of the lens array 140 is determined according to a divergence angle of the VCSEL light source 120, a pitch of the VCSEL light source 120, the number of light dots of the VCSEL light source 120, a pitch of each of the concave lenses, a sag height of each of the concave lenses, a pitch of each of the convex lenses, a sag height of each of the convex lenses, a substrate thickness of the lens array 140, a back focal length (BFL) between the VCSEL light source 120 and the lens array 140, or a combination thereof. For example, when the back focal length (BFL) between the VCSEL light source 120 and the lens array 140 decreases, the field of view (FOV) is correspondingly increased, but the number of the light dots of the dot pattern of the structured light is correspondingly decreased.

In the first embodiment of the present invention, the dot pattern of the structured light projected by the lens array 140 having a flat surface and a non-flat surface with the convex lenses arranged thereon is determined according to a divergence angle of the VCSEL light source 120, a pitch of the VCSEL light source 120, the number of light dots of the VCSEL light source 120, a pitch of each of the convex lenses, a sag height of each of the convex lenses, a substrate thickness of the lens array 140, a back focal length (BFL) between the VCSEL light source 120 and the lens array 140, or a combination thereof. For example, when the divergence angle of the VCSEL light source 120 increases, the field of view (FOV) is correspondingly increased, and the number of the light dots of the dot pattern of the structured light is correspondingly increased.

In the first embodiment of the present invention, an arrangement of the light dots of the VCSEL light source 120 may be designed to determine an arrangement of the light dots of the dot pattern of the structured light or to increase the number of the light dots of the dot pattern of the structured light. It is noted that the arrangement of the light dots of the VCSEL light source 120 is designed according to a pitch of each of the convex lenses of the lens array 140.

Figure 2:
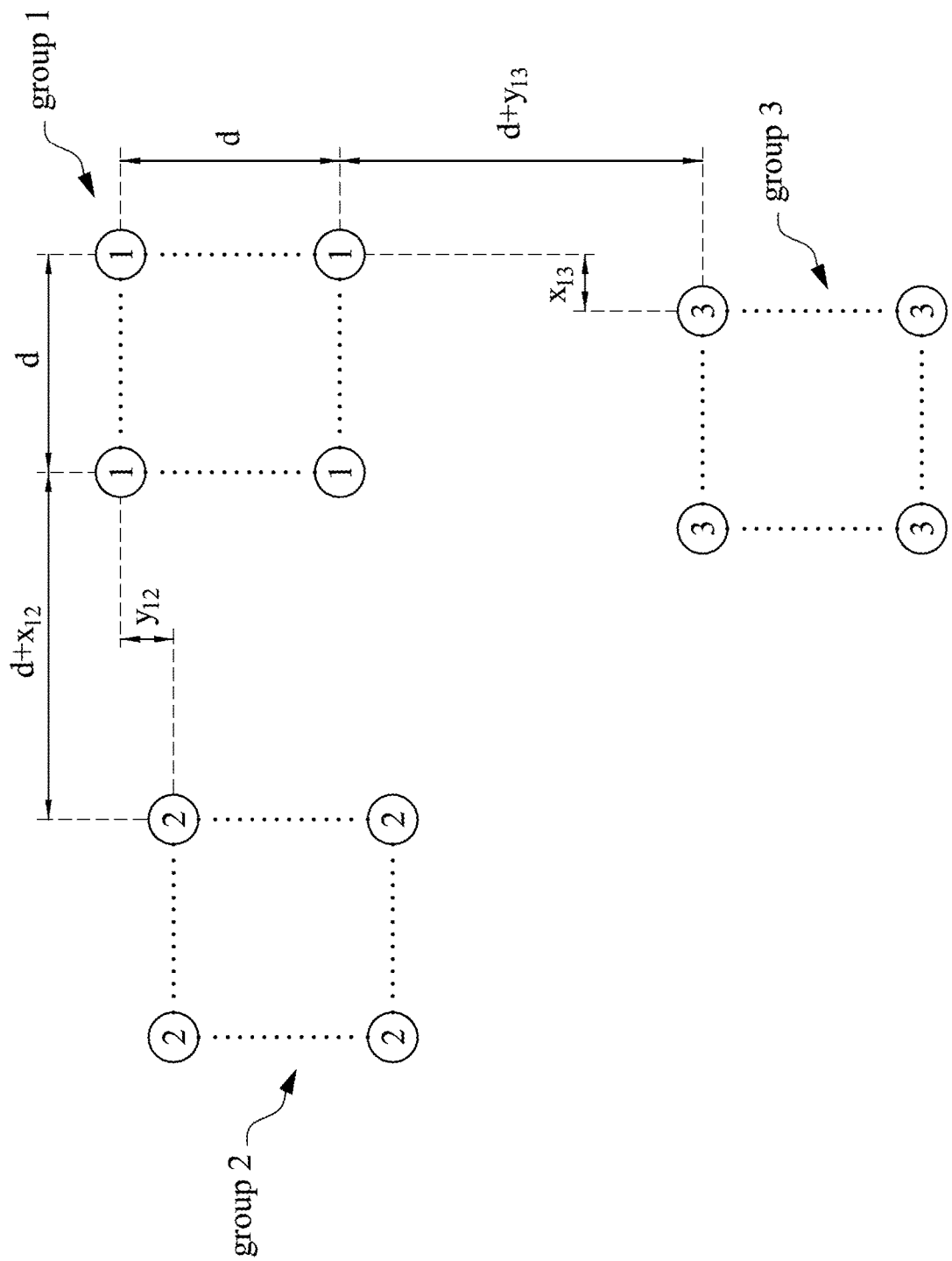
FIG. 2 illustrates one arrangement of the light dots of the VCSEL light source according to the first embodiment of the present invention.

FIG. 2 illustrates one arrangement of the light dots of the VCSEL light source 120 according to the first embodiment of the present invention. The VCSEL light source 120 includes three groups of light dots, i.e., the circles labeled as 1, 2, and 3 as shown in FIG. 2. It is noted that the distance d is the pitch of each of the convex lenses of the lens array 140. As shown in FIG. 2, the distances $d+x_{12}$ and $y_{12}$ respectively represent the closest horizontal distance and the closest vertical distance between the light dots of group 1 and 2, and the distances $x_{13}$ and $d+y_{13}$ respectively represent the closest horizontal distance and the closest vertical distance between the light dots of group 1 and 3.

Figure 3:
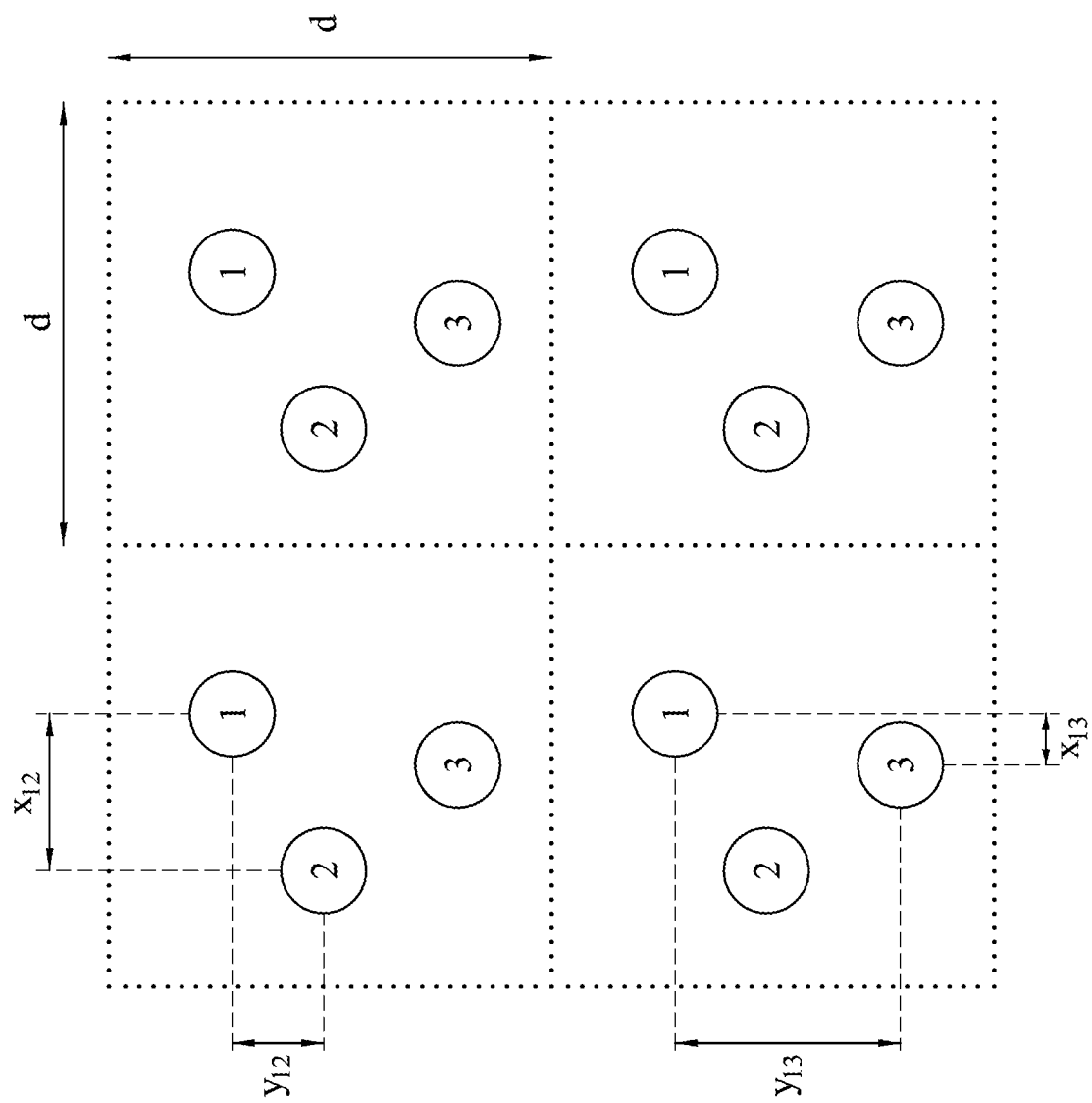
FIG. 3 illustrates another arrangement of the light dots of the VCSEL light source according to the first embodiment of the present invention.

FIG. 3 illustrates another arrangement of the light dots of the VCSEL light source 120 according to the first embodiment of the present invention. It is noted that the distance d represents the pitch of each of the convex lenses of the lens array 140. As shown in FIG. 3, the distances $x_{12}$ and $y_{12}$ respectively represent the closest horizontal distance and the closest vertical distance between two light dots of group 1 and 2, and the distances $x_{13}$ and $y_{13}$ respectively represent the closest horizontal distance and the closest vertical distance between two light dots of group 1 and 3. It is noted that the arrangements of the light dots of the VCSEL light source 120 as shown in FIGS. 2 and 3 are designed with intent to increase the irregularity of the dot pattern of the structured light, thereby reducing the difficulty for identifying the specific object.

Figure 4:
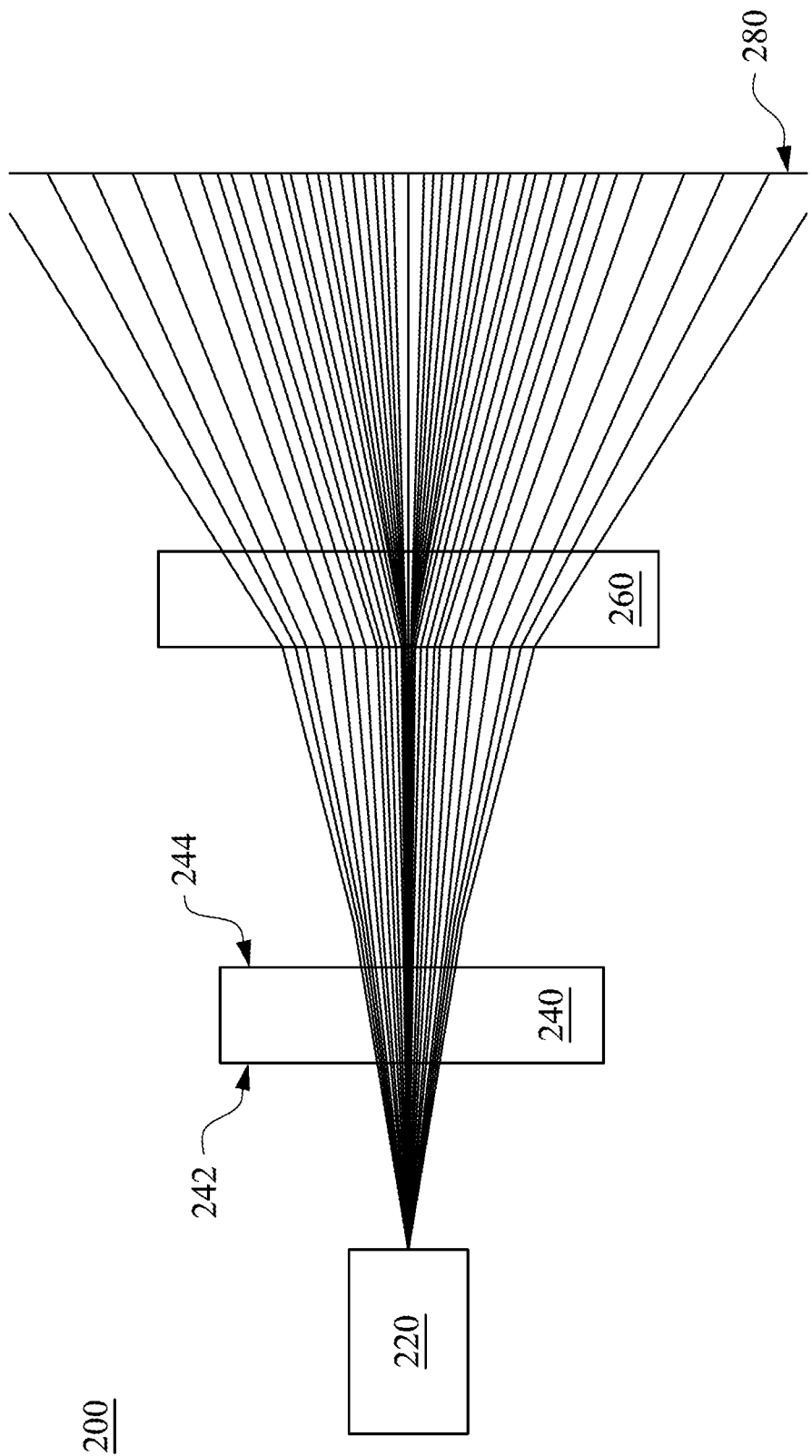
FIG. 4 illustrates an optical device according to a second embodiment of the present invention.

FIG. 4 illustrates an optical device 200 according to a second embodiment of the present invention. The optical device 200 includes a VCSEL light source 220, a lens array 240, and a diffractive optical element (DOE) 260. The VCSEL light source 220 is configured to emit light toward the lens array 240. In the second embodiment of the present invention, the VCSEL light source 220 may be a single point light source or a multi-point light source, such as a light source with 1×1 light dot, 3×3 light dots, or 9×9 light dots.

The lens array 240 is configured to receive light emitting from the VCSEL light source 220 and then project a patterned light with number of light dots. The number of light dots of the patterned light is larger than the number of light dots of the VCSEL light source 220. The DOE 260 is configured to fan out the patterned light and then project a structured light onto a plane 280. The structured light includes a dot pattern having number of light dots for specific purpose, such as 3D sensing or stereo image matching. The number of light dots of the dot pattern of the structured light is larger than the number of light dots of the patterned light. The lens array 240 has two surfaces opposite to each other, i.e., a light incident surface 242 and a light exit surface 244. The light incident surface 242 is closer to the VCSEL light source 220 than the light exit surface 244.

Plural concave lenses are arranged along the light incident surface 242 of the lens array 240, and plural convex lenses are arranged along the light exit surface 244 of the lens array 240. However, the second embodiment of the present invention is not limited thereto. For example, the light incident surface 242 may be a flat surface and the convex lenses may be arranged along the light exit surface 244 of the lens array 240. For another example, the convex lenses may be arranged along the light incident surface 242 of the lens array 240 and the light exit surface 244 may be a flat surface.

It is noted that the convex lenses are configured to generate the light dots of the patterned light. It is noted that the concave lenses are configured to increase field of view (FOV) of the optical device 200. It is noted that the DOE 260 is configured to increase field of view (FOV) of the optical device 200 and to generate the light dots of the dot pattern of the structured light.

In the second embodiment of the present invention, the dot pattern of the structured light projected by the DOE 260 is determined according to a divergence angle of the VCSEL light source 220, a pitch of the VCSEL light source 220, the number of light dots of the VCSEL light source 220, a pitch of each of the concave lenses, a sag height of each of the concave lenses, a pitch of each of the convex lenses, a sag height of each of the convex lenses, a substrate thickness of the lens array 240, a back focal length (BFL) between the VCSEL light source 220 and the lens array 240, a structure of the DOE 260, or a combination thereof.

In the second embodiment of the present invention, an arrangement of the light dots of the VCSEL light source 220 may be designed according to a pitch of each of the convex lenses to determine an arrangement of the light dots of the dot pattern of the structured light or to increase the number of the light dots of the dot pattern of the structured light.

In the second embodiment of the present invention, a structure of the DOE 260 is designed to diffract the patterned light so as to determine an arrangement of the light dots of the dot pattern of the structured light or to increase the number of the light dots of the dot pattern of the structured light. For example, the DOE 260 can provide the diffraction of the patterned light so as to generate different diffraction orders, thereby increasing the number of the light dots of the dot pattern of the structured light. Specifically, the DOE 260 can increase the density of the light dots of the dot pattern of the structured light.

From the above description, the present invention discloses one optical device including the VCSEL light source and the lens array and another optical device including the VCSEL light source, the lens array, and the DOE so as to provide the structured light includes a dot pattern having number of light dots. The optical devices of the present invention use the lens array, thereby having better space utilization. The optical devices of the present invention use the lens array and the DOE, thereby having lower energy loss.

Although the present invention has been described in considerable detail with reference to certain embodiments thereof, other embodiments are possible. Therefore, the spirit and scope of the appended claims should not be limited to the description of the embodiments contained herein. It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. An optical device, comprising:
   a Vertical-Cavity Surface-Emitting Laser (VCSEL) light source configured to emit light with at least one light dot; and
   a lens array configured to receive light emitting from the VCSEL light source and then project a structured light, wherein the structured light includes a dot pattern having number of light dots;
   wherein a space between the lens array and the VCSEL light source is free of intervening elements, such that the lens array directly receives the light emitted from the VCSEL light source without passing through any other element;
   wherein the lens array comprises a light incident surface and a light exit surface opposite to each other, and the light incident surface is closer to the VCSEL light source than the light exit surface;
   wherein the lens array comprises a plurality of concave lenses arranged along the light incident surface, and a plurality of convex lenses arranged along the light exit surface;
   wherein the concave lenses of the lens array are configured to increase field of view (FOV) of the optical device, and the convex lenses are configured to generate the light dots of the structured light; and
   wherein the number of the light dots of the structured light provided by the lens array is larger than the number of the light dots of the VCSEL light source;
   wherein the dot pattern of the structured light is determined according to a sag height of each of the convex lenses.

2. The optical device of claim 1, wherein an arrangement of the light dots of the VCSEL light source is designed according to a pitch of each of the convex lenses so as to determine an arrangement of the light dots of the dot pattern of the structured light or to increase the number of the light dots of the dot pattern of the structured light.

3. An optical device, comprising:
a VCSEL light source configured to emit light with at least one light dot;
a lens array configured to receive light emitting from the VCSEL light source and then provide a patterned light with number of light dots; and
a diffractive optical element (DOE) configured to fan out the patterned light and then project a structured light, wherein the structured light includes a dot pattern having number of light dots, wherein the DOE is configured to increase field of view (FOV) of the optical device and generate the light dots of the dot pattern;
wherein the number of light dots of the dot pattern is larger than the number of light dots of the patterned light;
wherein a space between the lens array and the VCSEL light source is free of intervening elements, such that the lens array directly receives the light emitted from the VCSEL light source without passing through any other element;
wherein the lens array comprises a light incident surface and a light exit surface opposite to each other, and the light incident surface is closer to the VCSEL light source than the light exit surface;
wherein the lens array comprises a plurality of concave lenses arranged along the light incident surface, and a plurality of convex lenses arranged along the light exit surface;
wherein the concave lenses of the lens array are configured to increase field of view (FOV) of the optical device, and the convex lenses are configured to generate the light dots of the patterned light; and
wherein the number of the light dots of the patterned light provided by the lens array is larger than the number of the light dots of the VCSEL light source;
wherein the dot pattern of the structured light is determined according to a sag height of each of the convex lenses.

4. The optical device of claim 3, wherein an arrangement of the light dots of the VCSEL light source is designed according to a pitch of each of the convex lenses so as to determine an arrangement of the light dots of the dot pattern of the structured light or to increase the number of the light dots of the dot pattern of the structured light.

5. The optical device of claim 3, wherein a structure of the DOE is designed to diffract the patterned light so as to determine an arrangement of the light dots of the dot pattern of the structured light or to increase the number of the light dots of the dot pattern of the structured light.

6. An optical device, comprising:
a Vertical-Cavity Surface-Emitting Laser (VCSEL) light source configured to emit light with at least one light dot; and
a lens array configured to receive light emitting from the VCSEL light source and then project a structured light, wherein the structured light includes a dot pattern having number of light dots;
wherein a space between the lens array and the VCSEL light source is free of intervening elements, such that the lens array directly receives the light emitted from the VCSEL light source without passing through any other element;
wherein the lens array comprises a light incident surface and a light exit surface opposite to each other, and the light incident surface is closer to the VCSEL light source than the light exit surface;
wherein the lens array comprises a plurality of concave lenses arranged along the light incident surface, and a plurality of convex lenses arranged along the light exit surface;
wherein the concave lenses of the lens array are configured to increase field of view (FOV) of the optical device, and the convex lenses are configured to generate the light dots of the structured light; and
wherein the number of the light dots of the structured light provided by the lens array is larger than the number of the light dots of the VCSEL light source;
wherein the dot pattern of the structured light is determined according to a back focal length (BFL) between the VCSEL light source and the lens array.

7. An optical device, comprising:
a VCSEL light source configured to emit light with at least one light dot;
a lens array configured to receive light emitting from the VCSEL light source and then provide a patterned light with number of light dots; and
a diffractive optical element (DOE) configured to fan out the patterned light and then project a structured light, wherein the structured light includes a dot pattern having number of light dots, wherein the DOE is configured to increase field of view (FOV) of the optical device and generate the light dots of the dot pattern;
wherein the number of light dots of the dot pattern is larger than the number of light dots of the patterned light;
wherein a space between the lens array and the VCSEL light source is free of intervening elements, such that the lens array directly receives the light emitted from the VCSEL light source without passing through any other element;
wherein the lens array comprises a light incident surface and a light exit surface opposite to each other, and the light incident surface is closer to the VCSEL light source than the light exit surface;
wherein the lens array comprises a plurality of concave lenses arranged along the light incident surface, and a plurality of convex lenses arranged along the light exit surface;
wherein the concave lenses of the lens array are configured to increase field of view (FOV) of the optical device, and the convex lenses are configured to generate the light dots of the patterned light; and
wherein the number of the light dots of the patterned light provided by the lens array is larger than the number of the light dots of the VCSEL light source;
wherein the dot pattern of the structured light is determined according to a back focal length (BFL) between the VCSEL light source and the lens array.

* * * * *